(12) United States Patent
Jeon

(10) Patent No.: US 7,507,597 B2
(45) Date of Patent: Mar. 24, 2009

(54) METHOD FOR FABRICATING CMOS IMAGE SENSOR

(75) Inventor: In Gyun Jeon, Gunpo-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 395 days.

(21) Appl. No.: 11/448,435

(22) Filed: Jun. 7, 2006

(65) Prior Publication Data
US 2006/0275942 A1   Dec. 7, 2006

(30) Foreign Application Priority Data
Jun. 7, 2005   (KR) ............... 10-2005-0048343

(51) Int. Cl.
*H01L 31/113*   (2006.01)
(52) U.S. Cl. .............. 438/57; 438/179; 438/286; 438/48; 257/E27.133
(58) Field of Classification Search ............ 438/48, 438/57, 179, 286
See application file for complete search history.

(56) References Cited

U.S. PATENT DOCUMENTS 7,214,575 B2 *   5/2007   Rhodes ............. 438/197
7,232,712 B2 *   6/2007   Han ................. 438/144
7,354,789 B2 *   4/2008   Han ................. 438/57
2005/0064665 A1 *   3/2005   Han ................. 438/286

* cited by examiner

Primary Examiner—Thanh Nguyen
(74) Attorney, Agent, or Firm—Saliwanchik, Lloyd & Saliwanchik

(57) ABSTRACT

A method of fabricating a CMOS image sensor is provided. The fabricating method includes: forming a gate electrode with a gate insulating layer interposed at a transistor region of a semiconductor substrate having an active region defined by a photodiode region and a transistor region; forming a first impurity region of a first conductive type at the transistor region of one side of the gate electrode; forming a first sidewall and a second sidewall at both sides of the gate electrode; forming a second impurity region of the first conductive type at the transistor region of the one side of the gate electrode; applying a photoresist layer on the semiconductor substrate, and patterning the photoresist layer to cover the transistor region through an exposing and developing process; forming a third impurity region of a second conductive type at the photodiode region using the patterned photoresist as a mask; selectively removing the first sidewall insulating layer between the second sidewall insulating layer and the gate electrode at a predetermined thickness using the patterned photoresist layer as a mask; covering the gate electrode by reflowing the patterned photoresist layer at a predetermined temperature; selectively removing the second sidewall insulating layer using the reflowed photoresist layer as a mask; and forming a fourth impurity region of the first conductive type at the side of the gate electrode where the third impurity region is formed using the reflowed photoresist layer as a mask.

18 Claims, 8 Drawing Sheets

METHOD FOR FABRICATING CMOS IMAGE SENSOR

RELATED APPLICATION

This application claims the benefit, under 35 U.S.C. §119 (e), of Korean Patent Application No. 10-2005-0048343 filed Jun. 7, 2005, which is incorporated herein by reference in its entirety.

FIELD OF THE INVENTION

The present invention relates to a method for fabricating a CMOS image sensor.

BACKGROUND OF THE INVENTION

Generally, an image sensor is a semiconductor device that transforms an optical image to an electric signal. An image sensor can be classified as a charge coupled device (CCD) or a complementary metal oxide silicon (CMOS) image sensor.

The CCD has shortcomings such as a complicated driving method and high power consumption. Also, the fabricating method of the CCD is complicated because a multi-level photolithography process is required.

Therefore, the CMOS image sensor has received attention as a next-generation image sensor to overcome the shortcomings of the CCD.

The CMOS image sensor is a device employing a switching mode that sequentially detects outputs of each unit pixel using MOS transistors. The switching mode incorporates MOS transistors at each unit pixel formed on a semiconductor substrate and a control circuit and a signal processing circuit as peripheral circuits.

The CMOS image sensor can be classified into types such as a 3T type, a 4T type, and a 5T type, according the number of transistors. For example, the 3T type CMOS image sensor includes one photodiode and three transistors, and the 4T type CMOS image sensor includes one photodiode and four transistors.

Hereinafter, the unit pixel of the 4T type CMOS image sensor will be described with reference to a plan view thereof.

As shown in FIG. 1, the unit pixel of the CMOS image sensor according to the prior art includes a photodiode 10 and four transistors as an optoelectric converter. The four transistors are a transfer transistor 20, a reset transistor 30, an access transistor 40 and a select transistor 50. In FIG. 1, FD denotes a floating diffusion region and a numeral reference 90 denotes a coupling portion connecting the FD and the access transistor 40. Vin denotes an input terminal, and Vout denotes an output terminal.

Hereinafter, the photodiode 10 and the transfer transistor 20 in the CMOS image sensor according to the prior art will be described with reference to a cross-section view through line I-I'.

As shown in FIG. 2, the transfer transistor 20 includes a gate insulating layer 21 and a gate electrode 23 formed on a substrate 11, and a first sidewall 29 and a second sidewall 31 formed at both sides of the gate electrode 23.

In addition, an n– type diffusion region (N–) 28 and a P° type diffusion region (PDP; P type photodiode implant) 35 are formed at the photodiode region (PD) of the substrate 11. The P° type diffusion region 35 is formed on the n– type diffusion region 28. Also, a heavily doped n+ type diffusion region (N+) 32 and a lightly doped n– type diffusion region (N–) 26 are formed at the floating diffusion region (FD) of the substrate 11.

FIG. 3 is a cross-sectional view for describing one of the fabricating processes for a CMOS image sensor according to the prior art.

As shown in FIG. 3, a photoresist layer 27 is applied on an entire surface of the substrate 11, and the applied photoresist layer 27 is patterned to expose the photodiode region (PD) through an exposing and developing process.

Then, the lightly doped n– type diffusion region 28 is formed at the photodiode region by implanting an n type impurity ion in to the substrate 11 with an ion implantation energy of 100 KeV to 500 KeV using the patterned photoresist layer 27 as a hard mask.

The impurity ion implantation for forming the lightly doped n– type diffusion region 28 at the photodiode region is performed with the ion implanting energy higher than that for forming the lightly doped n– type diffusion region 26 at the floating diffusion region such that the lightly doped n– type diffusion region 28 is formed more deeply into the substrate.

However, the method for fabricating the CMOS image sensor according to the prior art has problems as follows.

That is, in order to use the n– type diffusion region 28 formed at the photodiode region as the source of the transfer transistor 20, a predetermined region of the upper portion of the gate electrode 23 must be exposed during the photolithography process.

In particular, the photoresist layer 27 does not cover the entire transfer transistor 20. For example, the photoresist layer 27 is applied to expose a predetermined portion of the gate electrode 23 in a source side so that the photoresist layer 27 is self-aligned at the gate electrode 23 when the ion implantation process is performed.

The impurity ion is also implanted at the exposed portion A of the gate electrode 23 because of the ion implantation energy applied such as in a range from 100 KeV to 500 KeV when the ion implantation is performed for forming the n– type diffusion region 28. Therefore, a characteristic of the transfer transistor 20 is changed and a characteristic of the image sensor can also be degraded thereby.

SUMMARY OF THE INVENTION

Accordingly, the present invention is directed to a method for fabricating a CMOS image sensor that can address problems of the prior art.

An object of the present invention is to provide a method for fabricating a CMOS image sensor for improving a characteristic of an image sensor by preventing a characteristic of a transfer transistor from being changed.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method of fabricating a CMOS image, the method including: forming a gate electrode with a gate insulating layer interposed at a transistor region of a semiconductor substrate having an active region defined by a photodiode region and a transistor region; forming a first impurity region of a first conductive type at the transistor region of one side of the gate electrode; forming a first sidewall and a second sidewall at both sides of the gate electrode; forming a second impurity region of the first conductive type at the transistor region of one side of the gate electrode; applying a photoresist layer on the semiconductor substrate, and patterning the photoresist layer to cover the transistor region through an exposing and developing process; forming a third impurity region of a second conductive type at the photodiode region using the patterned photoresist as a mask; selectively removing the first sidewall insulating layer between the second sidewall insulating layer and the gate electrode at a predetermined thickness using the patterned photoresist layer as a mask; covering the gate electrode by reflowing the patterned photoresist layer at a predetermined temperature; selectively removing the second sidewall insulating layer using the reflowed photoresist layer as a mask; and forming a fourth impurity region of the first conductive type at one side of the gate electrode where the third impurity region is formed using the reflowed photoresist layer as a mask.

According to the present invention, a characteristic of the image sensor can be improved because the characteristic variation of the transfer transistor can be minimized by minimizing an amount of impurity ions implanted into a gate electrode by safely blocking the gate electrode when an ion implantation is performed to form a lightly doped n− diffusion region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for fabricating a CMOS image sensor according to the embodiments of the present invention will be described in detail with reference to the accompanying drawings.

An embodiment according to the present invention relates to a method for fabricating a CMOS image sensor having an NMOS transistor. It is obvious to those skilled in the art that the present invention can be applied to a method for fabricating a CMOS transistor having a PMOS transistor.

An embodiment according to the present invention relates to a method for fabricating a CMOS image sensor having four transistors. It is obvious to those skilled in the art that the present invention can be applied to a method for fabricating a CMOS transistor having any number of transistors such as one, three and five transistors.

FIGS. 4A through 4K are cross-sectional views for describing a method for fabricating a CMOS image sensor having an NMOS transistor according to an embodiment of the present invention.

Figure 1:
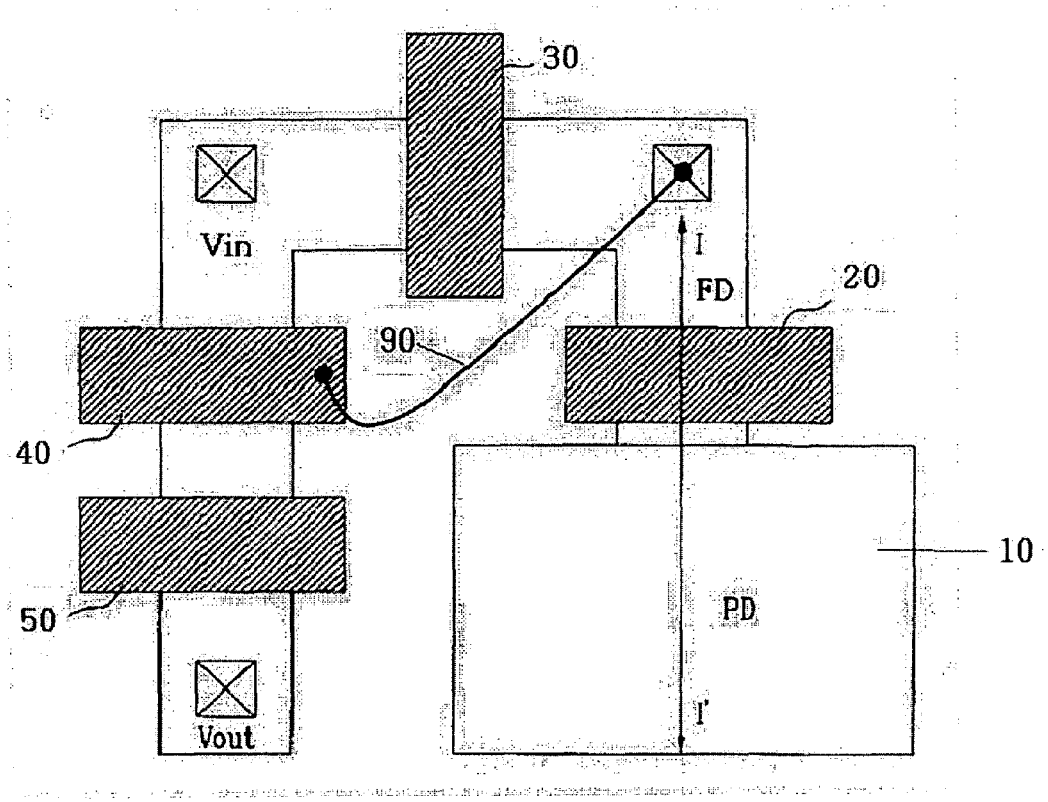
FIG. 1 is a plan view of a unit pixel of a 4T type CMOS image sensor according to the prior art.
Figure 2:
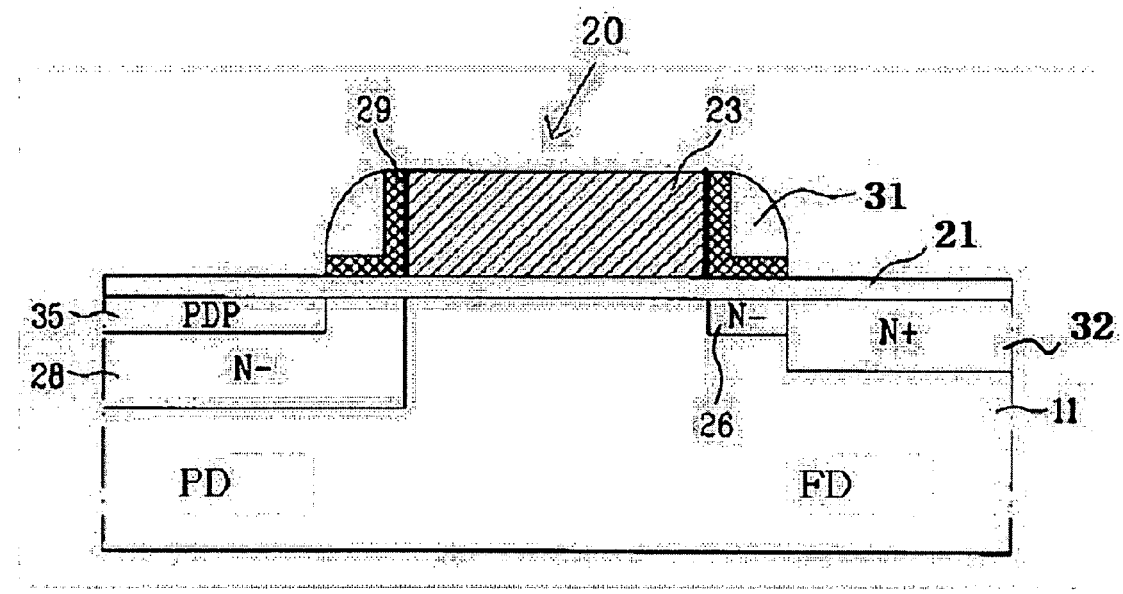
FIG. 2 is a cross-sectional view taken along the line I-I' of FIG. 1 for illustrating a photodiode and a transfer gate.
Figure 3:
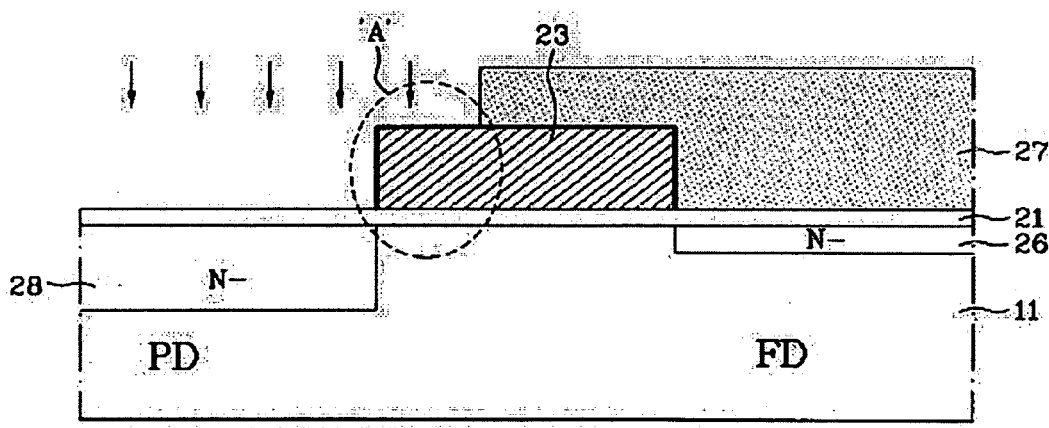
FIG. 3 is a cross-sectional view for describing one of fabricating processes for a CMOS transistor according to the prior art.
Figure 4A:
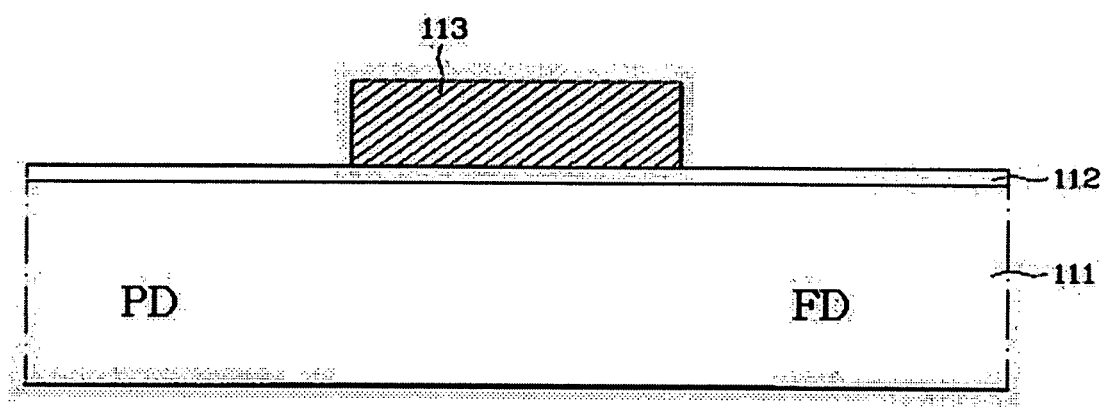
FIGS. 4A through 4K are cross-sectional views for describing a method for fabricating a CMOS image sensor according to an embodiment of the present invention.

As shown in FIG. 4A, a substrate 11 is prepared. The substrate 11 can incorporate a floating diffusion region (FD region) and a photodiode region (RD region).

In addition, at the substrate 111, a lightly doped P− type epitaxial layer can be formed through an epitaxial process. For example, heavily doped P++ type mono crystal silicon, or a P well can be formed by ion implantation.

The epitaxial layer or the P well is formed for improving the capability of a low-voltage photodiode for accumulating photo-charge and for improving photo sensitivity thereof by greatly and deeply forming the depletion region at the photodiode.

After forming the epitaxial layer or the P well, a gate insulating layer 112 and a conductive layer, for example, a heavily doped poly-crystal silicon layer, are sequentially deposited. Then, a gate electrode 113 is formed by selectively removing the conductive layer through photolithography and an etching processes.

The gate insulating layer 112 can be formed by performing a thermal oxidation process or a chemical vapor deposition (CVD) on the semiconductor substrate.

In a further embodiment, a silicide layer (not shown) can be formed on the gate electrode 113.

Figure 4B:
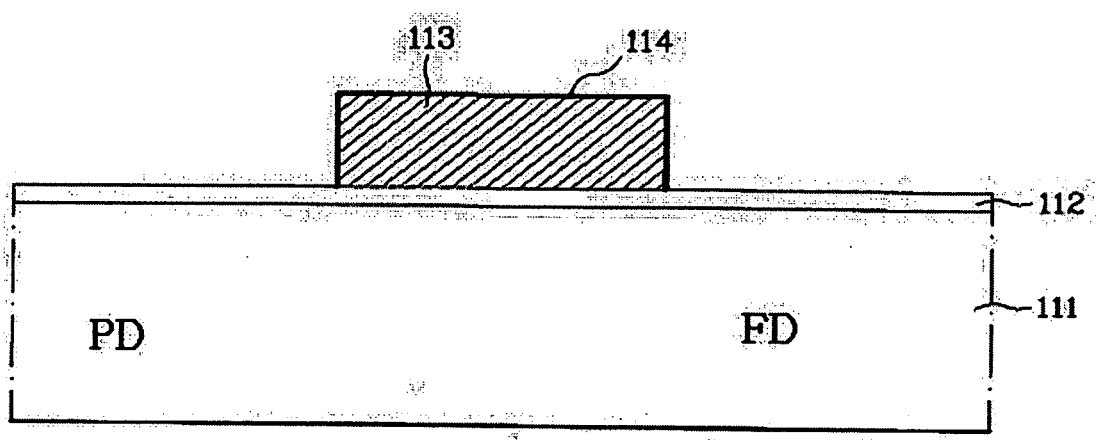

Then, as shown in FIG. 4B, about 60 Å of an oxide layer 114 can be formed on the gate electrode 113. The oxide layer 114 can be formed by a thermal oxidation process. The oxide layer 114 can function as a gate sidewall for implanting ions for source/drain of a transistor.

Figure 4C:
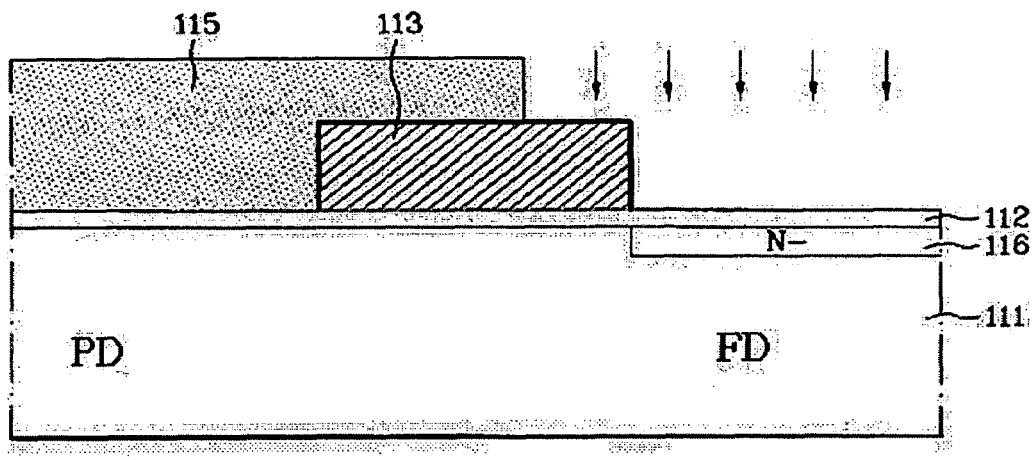

Then, as shown in FIG. 4C, a first photoresist layer 115 is applied on the substrate 111 and patterned to expose a floating diffusion region and to cover the photodiode region through an exposing and developing process.

Then, a lightly doped n− type diffusion region (N−) 116 can be formed by implanting n type impurity ions into the exposed floating diffusion region using the patterned first photoresist layer 115 as a hard mask.

Figure 4D:
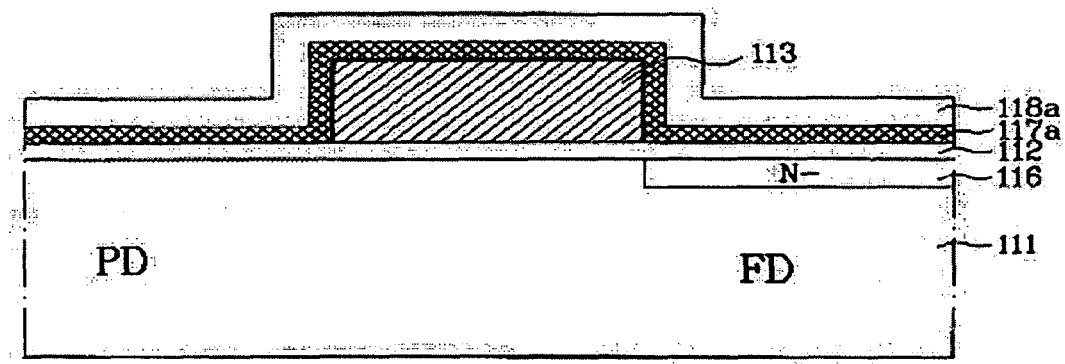

Then, as shown in FIG. 4D, a first insulating layer 117a and a second insulating layer 118a can be sequentially formed on the entire surface of the substrate 111 after removing the first photoresist layer 115. The first and the second insulating layer 117a and 118a can be formed by sequentially forming an oxide layer 117a and a nitride layer 118a through a chemical vapor deposition (CVD) and a lower pressure chemical vapor deposition (LPCVD).

In an embodiment, the oxide layer 117a is formed to have a thickness of about 150 Å to 250 Å, and the nitride layer 118a is formed to have a thickness of about 700 Å to 900 Å. In a specific embodiment, the oxide layer 117a is formed to have a thickness of about 200 Å and the nitride layer 118a is formed to have a thickness of about 800 Å.

Figure 4E:
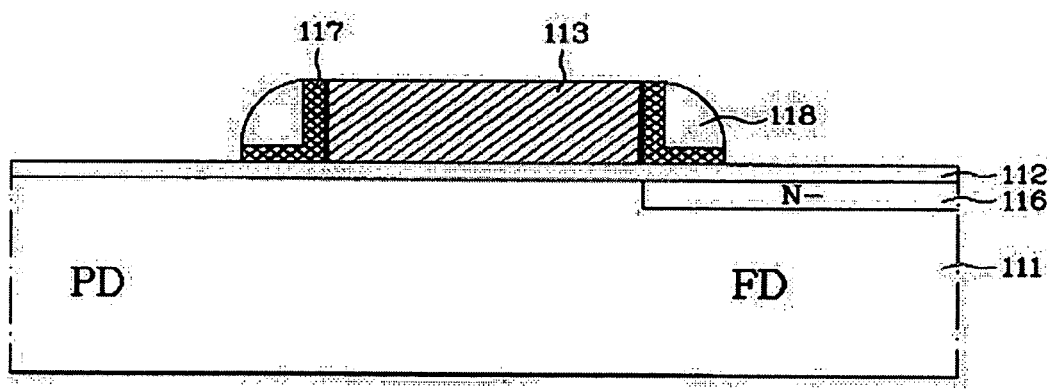

Then, as shown in FIG. 4E, spacers having the oxide layer 117 and the nitride layer 118 can be formed at both sides of the gate electrode 113 by etching the nitride layer 118a and the oxide layer 117a. A dry etching, for example, an etch-back process, can be used to etch the nitride layer 118a and the oxide layer 117a to form the spacers.

Figure 4F:
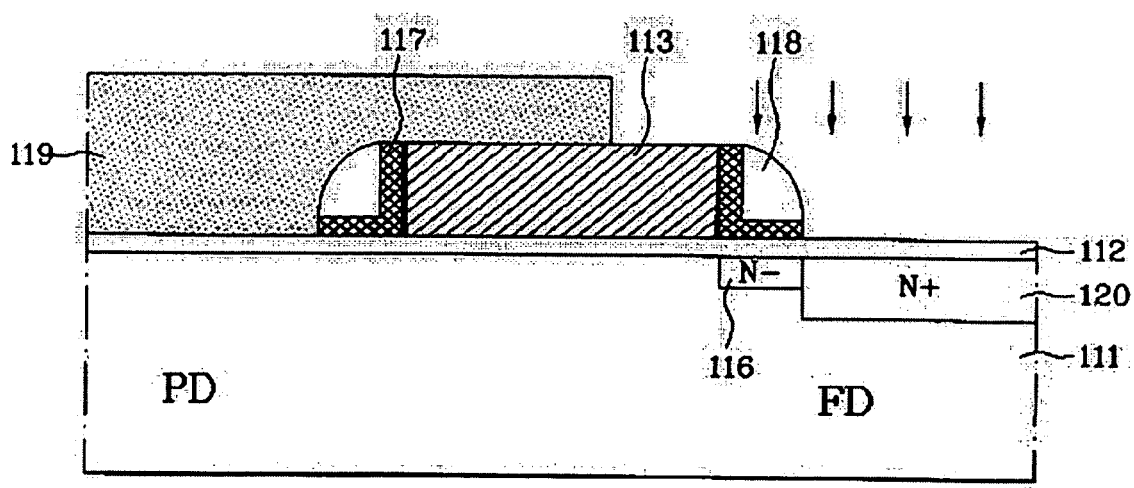

Then, as shown in FIG. 4F, a second photoresist layer 119 is applied on the entire surface of the substrate 111 and patterned to expose the floating diffusion region and to cover the photodiode region through an exposing and developing process.

After patterning, an n+ diffusion region (N+) 120 is formed by implanting n type impurity ions into the floating diffusion region using the patterned second photoresist layer 119 as a hard mask.

Figure 4G:
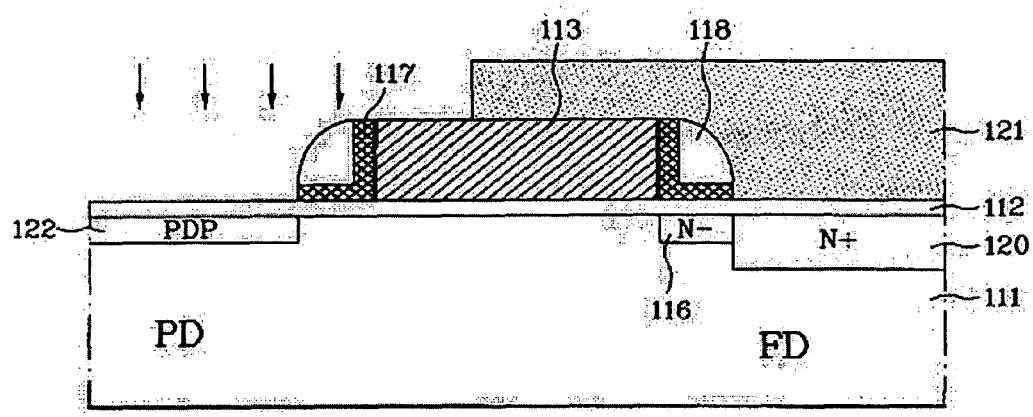

Then, as shown in FIG. 4G, the second photoresist layer 119 is removed, and a third photoresist layer 121 is applied on the entire surface of the substrate 111. Then, the third photoresist layer 121 is patterned to expose the photodiode region through an exposing and developing process.

Then, a $P^o$ diffusion region (PDP) 122 is formed on the substrate 111 by implanting $P^o$ type impurity ion using the patterned third photoresist layer 121 as a hard mask.

In embodiments of the subject method, the $P^o$ impurity ion can be $BF_2$ or Boron. When $BF_2$ is used as the $P^o$ impurity ion, the $BF_2$ ion can be implanted at a dose of about $1\times10^{11}$ and $5\times10^{12}$ atoms/cm$^2$ and an implanting energy of less than 40 KeV.

The $P^o$ diffusion region (PDP) 122 can be doped to have about $1\times10^{16}$ to $5\times10^{17}$ atoms/cm$^3$.

Since the $BF_2$ ion implantation is performed at less than 40 KeV of ion implanting energy, any thermal impact is not applied to the gate electrode 113.

Figure 4H:
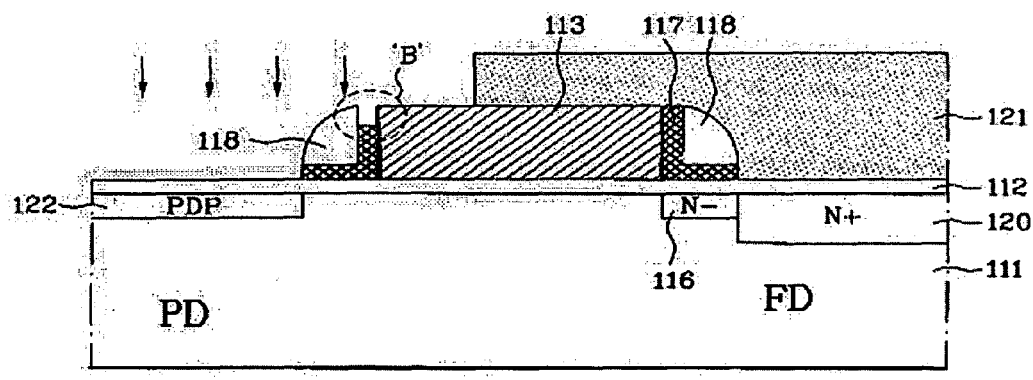

Then, as shown in FIG. 4H, a hole B is formed between the gate electrode 113 and the nitride layer 118 by selectively removing the oxide layer 117 using the third photoresist layer 121 as a hard mask.

The hole B can function as a flow barrier of the third photoresist layer 121 when reflowing the third photoresist layer 121. That is, the hole B can improve the reflow uniformity of the third photoresist 121.

Figure 4I:
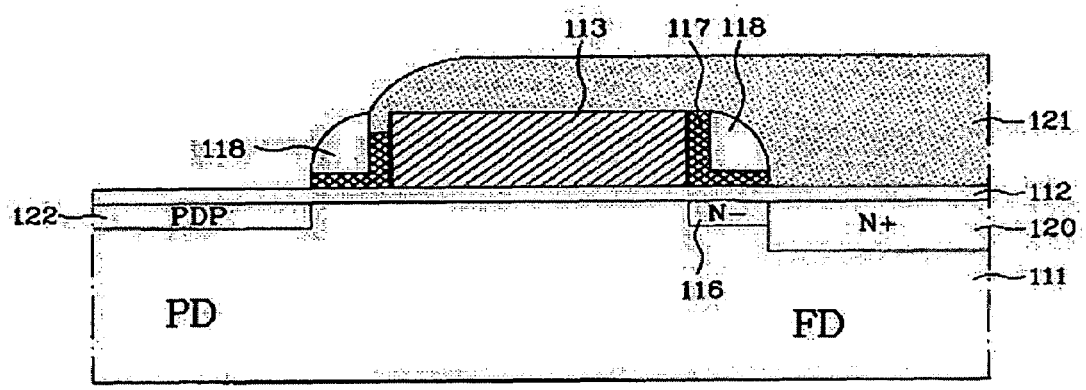

Then, as shown in FIG. 4I, the patterned third photoresist layer 121 is reflowed at a temperature about 100° C. to 300° C.

The exposed gate electrode 113 becomes covered with the reflowed third photoresist layer 121 by the reflowing process of the third photoresist layer 121.

In a specific embodiment, the gate electrode 113 can have better coverage by as much as about 0.4 μm and less compared to the gate electrode 113 covered only by the firstly patterned third photoresist layer 113, and the reflow process can be performed in a range of reflowing of the photoresist layer 121 not to exceed the upper width of the gate electrode 113.

Figure 4J:
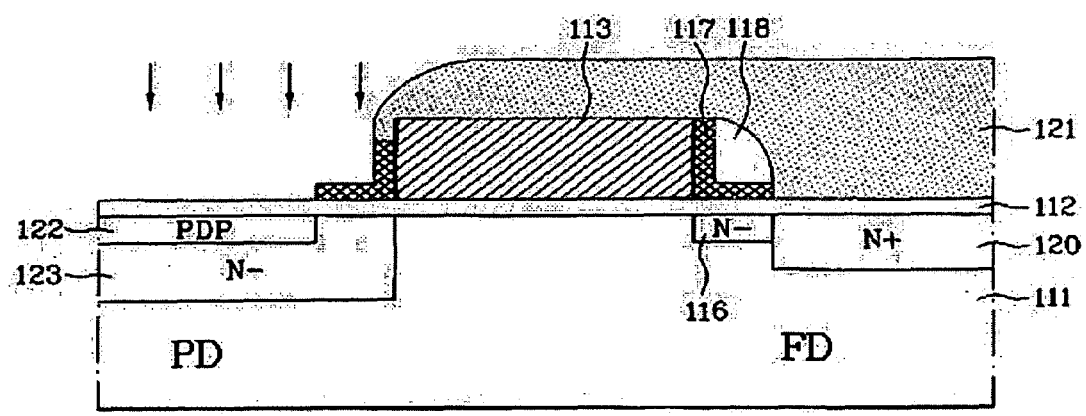

In the embodiment shown in FIGS. 4I and 4J, the reflowing of the third photo resist layer 121 is stopped at the hole B where the oxide layer 117 is removed between the nitride 118 and the gate electrode 113.

Then, as shown in FIG. 4J, the exposed nitride layer 118 is selective removed using the reflowed third photoresist layer 121 as a hard mask.

In one embodiment, a wet etching process can be used to selectively remove the nitride layer 118.

Then, a lightly doped n− type diffusion region (N−) 123 can be formed at the photodiode region of the substrate 111 by implanting n type impurity ions at an ion implantation energy of about 100 KeV to 500 KeV using the reflowed third photoresist layer 121 as a hard mask.

When the lightly doped n− type ion is implanted, the gate electrode 113 is safely blocked by the reflowed third photoresist layer 121 that covers the opened region of the gate electrode 113. Therefore, the gate electrode 113 is effectively protected from the impurity ion which would have been implanted into the gate electrode 113.

Accordingly, the characteristics of the transistor are not changed. Therefore, the degradation of the CMOS image sensor is effectively prevented.

In an embodiment, the impurity ion for forming the lightly doped n− diffusion region 123 at the photodiode region can be implanted more deeply than the lightly doped n− diffusion region 116 of the floating diffusion region by applying higher implanting energy.

Figure 4K:
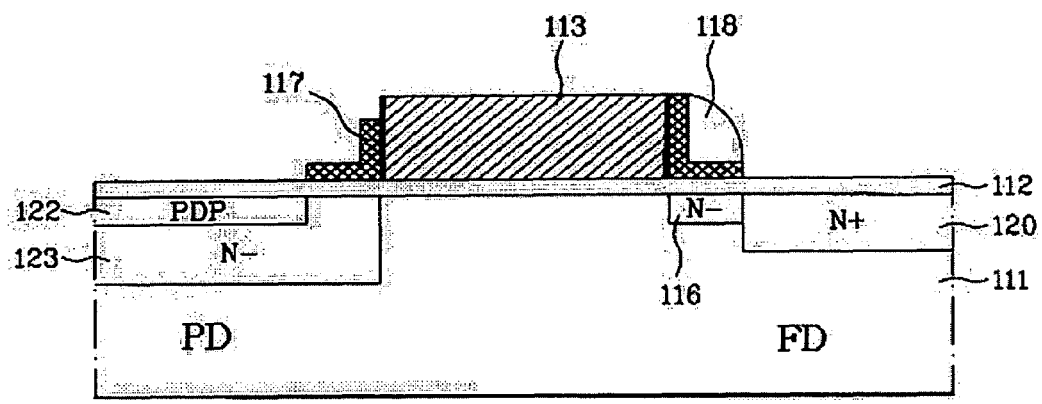

Then, as shown in FIG. 4K, the impurity ions in the n− type diffusion region 123, the $P^o$ type diffusion region 122, the n− type diffusion region 116 and the n+ type diffusion region 120 can be diffused by performing a thermal process on the substrate 111 at a temperature about 800° C. to 1200° C. after removing the third photoresist layer 121.

In the present embodiment, the n− type diffusion region 123 is formed at the photodiode region after selectively removing the oxide layer 117 for the spacer using the third photoresist layer 121 that is used for forming the $P^o$ type diffusion region 122 as the hard mask.

However, in an alternate embodiment, the n− type diffusion region 123 can be formed at the photodiode region after forming the $P^o$ diffusion region 122, removing the third photoresist layer 121, applying an additional photoresist layer, patterning the additional photoresist layer through the exposing and developing process, and selectively removing the oxide layer 117 for the spacer using the patterned additional photoresist layer as a mask.

The CMOS image sensor according to the present invention can have advantages as follows.

The opened portion of the gate electrode 113 can be covered by the reflowed third photoresist layer 121 during the ion implantation performed to form the lightly doped n− type diffusion region 123, which is used as a source of the transfer transistor at the photodiode region.

Accordingly, the gate electrode 113 is safely blocked from the impurity ion when the ion implantation is performed for forming the lightly doped n− type diffusion region 123. Therefore, the characteristics variation of the transfer transistor is minimized by minimizing the impurity ion implanted into the gate electrode 113.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method of fabricating a CMOS image sensor comprising:

forming a gate electrode with a gate insulating layer interposed at a transistor region of a semiconductor substrate having an active region defined by a photodiode region and a transistor region;

forming a first impurity region of a first conductive type at the transistor region of a first side of the gate electrode;

forming a first sidewall of a first insulating layer and a second sidewall of a second insulating layer at the first and a second side of the gate electrode;

forming a second impurity region of the first conductive type at the transistor region of the first side of the gate electrode;

applying a photoresist layer on the semiconductor substrate, and patterning the photoresist layer to cover the transistor region through an exposing and developing process;

forming a third impurity region of a second conductive type at the photodiode region using the patterned photoresist as a mask;

selectively removing a portion of the first sidewall between the second sidewall and the gate electrode at a predetermined thickness using the patterned photoresist layer as a mask;

covering the gate electrode by reflowing the patterned photoresist layer at a predetermined temperature;

selectively removing the second sidewall using the reflowed photoresist layer as a mask; and forming a fourth impurity region of the first conductive type at the second side of the gate electrode.

2. The method according to claim 1, wherein the second impurity region is formed deeper in the substrate than the first impurity region.

3. The method according to claim 1, further comprising forming an oxide layer on the gate electrode at a thickness of 60 Å and less.

4. The method according to claim 1, wherein the reflowing of the photoresist is performed at a temperature of 100° C. to 300° C.

5. The method according to claim 1, further comprising performing a thermal process on the substrate after forming the fourth impurity region.

6. The method according to claim 1, wherein the first insulating layer and the second insulating layer are formed of insulating layers having a different etching selectivity.

7. The method according to claim 1, wherein the second sidewall is selectively removed by a wet etching process.

8. The method according to claim 1, wherein the fourth impurity region is formed deeper into the substrate than the first impurity region.

9. The method according to claim 1, wherein forming the third impurity region comprises implanting $BF_2$ or Boron.

10. The method according to claim 9, wherein the $BF_2$ is implanted at dose of $1\times10^{11}$ to $5\times10^{12}$ atoms/cm$^2$.

11. The method according to claim 9, wherein implanting $BF_2$ is performed at an implanting energy of less than 40 KeV.

12. The method according to claim 9, wherein the third impurity region has $1\times10^{16}$ to $5\times10^{17}$ atoms/cm$^3$.

13. The method according to claim 1, wherein the first insulating layer is an oxide layer, and the second insulating layer is a nitride layer.

14. The method according to claim 1, wherein the first insulating layer is 150 Å to 250 Å, and the second insulating layer is 700 Å to 900 Å.

15. The method according to claim 1, wherein forming a first sidewall of a first insulating layer and a second sidewall of a second insulating layer, comprises performing an etch-back process on the first insulating layer and the second insulating layer.

16. The method according to claim 1, wherein selectively removing a portion of the first sidewall comprises performing a wet etching process on the first insulating layer using the patterned photoresist layer as a hard mask.

17. The method according to claim 1, wherein covering the gate electrode reflows the patterned photoresist layer to be one-dimensionally extended about 0.4 μm and less.

18. The method according to claim 1, wherein the reflowed patterned photoresist layer does not exceed covering the gate electrode.

* * * * *